US009093249B2

(12) United States Patent
Anderson et al.

(10) Patent No.: US 9,093,249 B2
(45) Date of Patent: Jul. 28, 2015

(54) SPARSE SAMPLING AND RECONSTRUCTION FOR ELECTRON AND SCANNING PROBE MICROSCOPE IMAGING

(71) Applicant: Sandia Corporation, Albuquerque, NM (US)

(72) Inventors: Hyrum Anderson, Albuquerque, NM (US); Jovana Helms, Dublin, CA (US); Jason W. Wheeler, Albuquerque, NM (US); Kurt W. Larson, Cedar Crest, NM (US); Brandon R. Rohrer, Boston, MA (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/482,754

(22) Filed: Sep. 10, 2014

(65) Prior Publication Data

US 2015/0069233 A1 Mar. 12, 2015

Related U.S. Application Data

(60) Provisional application No. 61/877,109, filed on Sep. 12, 2013.

(51) Int. Cl.
*H01J 37/26* (2006.01)
*H01J 37/256* (2006.01)
*G01N 23/225* (2006.01)
*H01J 37/22* (2006.01)
*H01J 37/28* (2006.01)

(52) U.S. Cl.
CPC ............... *H01J 37/222* (2013.01); *H01J 37/28* (2013.01); *H01J 2237/226* (2013.01); *H01J 2237/2809* (2013.01)

(58) Field of Classification Search
CPC ...... H01J 37/08; H01J 37/28; H01J 2237/202; H01J 37/3174; H01J 2237/226; H01J 2237/2809
USPC ............ 250/310, 311, 306, 307; 850/1, 5, 21
See application file for complete search history.

(56) References Cited

U.S. PATENT DOCUMENTS

2004/0121069 A1* 6/2004 Ferranti et al. ............... 427/140
2007/0164218 A1* 7/2007 Jesse et al. .................... 250/310

OTHER PUBLICATIONS

Song, et al., "Video Rate Atomic Force Microscopy (AFM) Imaging Using Compressive Sensing", Proc. IEEE Conf. Nanotechnology, 2011, pp. 1056-1059.
Binev, et al, "Compressed Sensing and Electron Microscopy," in Modeling Nanoscale Imaging in Electron Microscopy (T. Vogt, W. Dahmen, P. Binev, eds.), Springer (2012), pp. 1-52.
(Continued)

*Primary Examiner* — Nikita Wells
(74) *Attorney, Agent, or Firm* — Michael A. Beckett

(57) ABSTRACT

Systems and methods for conducting electron or scanning probe microscopy are provided herein. In a general embodiment, the systems and methods for conducting electron or scanning probe microscopy with an undersampled data set include: driving an electron beam or probe to scan across a sample and visit a subset of pixel locations of the sample that are randomly or pseudo-randomly designated; determining actual pixel locations on the sample that are visited by the electron beam or probe; and processing data collected by detectors from the visits of the electron beam or probe at the actual pixel locations and recovering a reconstructed image of the sample.

20 Claims, 12 Drawing Sheets

(56) References Cited

OTHER PUBLICATIONS

Anderson, et al., "Sparse Imaging for Fast Electron Microscopy", Computational Imaging XL, vol. 8657, id. 86570C, 2013, pp. 12.

Goldstein, et al. "The Split Bregman Method for L1-Regularized Problems," SIAM Journal on Imaging Sciences 2(2), 2009, pp. 323-343.

Briggman, et al., "Towards Neural Circuit Reconstruction With Volume Electron Microscopy Techniques", Neurobiology, vol. 16, 2006, pp. 562-570.

Anderson, et al., "Exploring the Retinal Connectome," Molecular Vision, vol. 17, 2011, pp. 355-379.

Ogura, et al., "Gigantic Montages With a Fully Automated FE-SEM (Serial Sections of a Mouse Brain Tissue)", Microscopy Society of America, 16 (Suppl 2), 2010, pp. 52-53.

Shiveley, et al., "A Novel Method for Acquiring Large-Scale Automated Scanning Electron Microscope Data", Journal of Microscopy, vol. 244, Pt. 2, 2011, pp. 181-186.

Hayworth, et al., "Automating the Collection of Ultrathin Serial Sections for Large Volume TEM Reconstructions", Microsc Microanal, 12 (Supp 2), 2006, pp. 86-87.

Hu, et al., "Super-Resolution Using Sparse Representations Over Learned Dictionaries: Reconstruction of Brain Structure Using Electron Microscopy", arXiv:1210.0564, 2010, pp. 1-12.

Candes, "The Restricted Isometry Property and Its Implications for Compressed Sensing", Academic des Sciences, Ser. I 346, 2008, pp. 589-592.

Donoho, et al., "Stable Recovery of Sparse Overcomplete Representations in the Presence of Noise", IEEE Transactions on Information Theory, vol. 52, No. 1, 2006, pp. 6-18.

\* cited by examiner

US 9,093,249 B2

SPARSE SAMPLING AND RECONSTRUCTION FOR ELECTRON AND SCANNING PROBE MICROSCOPE IMAGING

RELATED APPLICATION

This application claims priority to United States Provisional Patent Application No. 61/877,109, filed on Sep. 12, 2013, and entitled "SPARSE SAMPLING AND RECONSTRUCTION FOR SCANNING ELECTRON MICROSCOPE IMAGING", the entirety of which is incorporated herein by reference.

STATEMENT OF GOVERNMENTAL INTEREST

This invention was made with Government support under Contract No. DE-AC04-94AL85000 between Sandia Corporation and the U.S. Department of Energy. The Government has certain rights in the invention.

BACKGROUND

Electron microscopes are used in neuroscience, microbiology and materials science for high-resolution imaging and subsequent structural or compositional analysis. In particular, many applications that utilize a scanning electron microscope (SEM) require imaging millimeters or even centimeters of material at nanometer resolutions, leading to semi-autonomous operation of the SEM, weeks of around-the-clock collection time, and vast quantities of data. Scanning probe microscopes are similarly limited.

A traditional SEM operates in raster mode, visiting every "pixel" location in sequence. Many engineering advances have been proposed to increase the speed of raster mode through faster scanning coils, or efficiency gains through image acquisition buffers and communications protocols. Nevertheless, there is a need to provide faster scan times. Advancements that provide speedup in series with any of the aforementioned engineering advances would be particularly beneficial.

Interpolation methods of sampling and imaging, such as bilinear interpolation, are known, but are difficult to apply in high noise environments. A structured sampling methodology, such as interpolation, may also miss details that are regularly structured in a way that avoids recognition of the structure of the sample.

SUMMARY

Systems and methods for electron and scanning probe microscope imaging are provided herein. In a general embodiment, the present disclosure provides a method for conducting electron or scanning probe microscopy. The method comprises driving an electron beam or probe to scan across a sample and visit a subset of pixel locations of the sample that are randomly or pseudo-randomly designated; determining actual pixel locations on the sample that are visited by the electron beam or probe; and processing data collected by detectors from the visits of the electron beam or probe at the actual pixel locations and recovering a reconstructed image of the sample.

In another embodiment, the present disclosure provides a retrofit to existing scanning probe or electron microscopes to speed up image acquisition by about two times or greater while providing "smooth" images in which the electron probe measures one-at-a-time a randomly-selected subset of the pixel locations. Smooth images have features that are relatively few and large compared to the pixel spacing. Smooth images are highly compressible. This solution may be particularly desirable in very long collections, such as those needed in biology, neuroscience and materials science.

In an embodiment, image reconstruction is performed using a compressive sensing inversion method/split Bergman method that utilizes a total variation prior. Significantly, this has been demonstrated in an operational SEM. Speedups of 4× and more have been accomplished.

Further details of embodiments of the systems and methods described herein are provided in the publication Hyrum S. Anderson, et al, "Sparse imaging for fast electron microscopy," Proceedings of the SPIE, Vol. 8657, id. 86570C 12 pp. (2013), which is incorporated herein by reference for all purposes.

Additional features and advantages are described herein, and will be apparent from the following Detailed Description and the figures.

DETAILED DESCRIPTION

Systems and methods for electron and scanning probe microscope imaging are provided herein. Because SEMs are innately single-detector scanning systems, the time to acquire thousands of images of tissue or material for analysis can be extremely prohibitive for many applications. In a general embodiment, the present disclosure provides a system and method (demonstrated on an operational SEM) for a sparse sampling scheme that leverages image smoothness for compressed sensing inversion. Accurate knowledge of the probe location is utilized, and is accounted for through a linear dynamical model.

Figure 1:
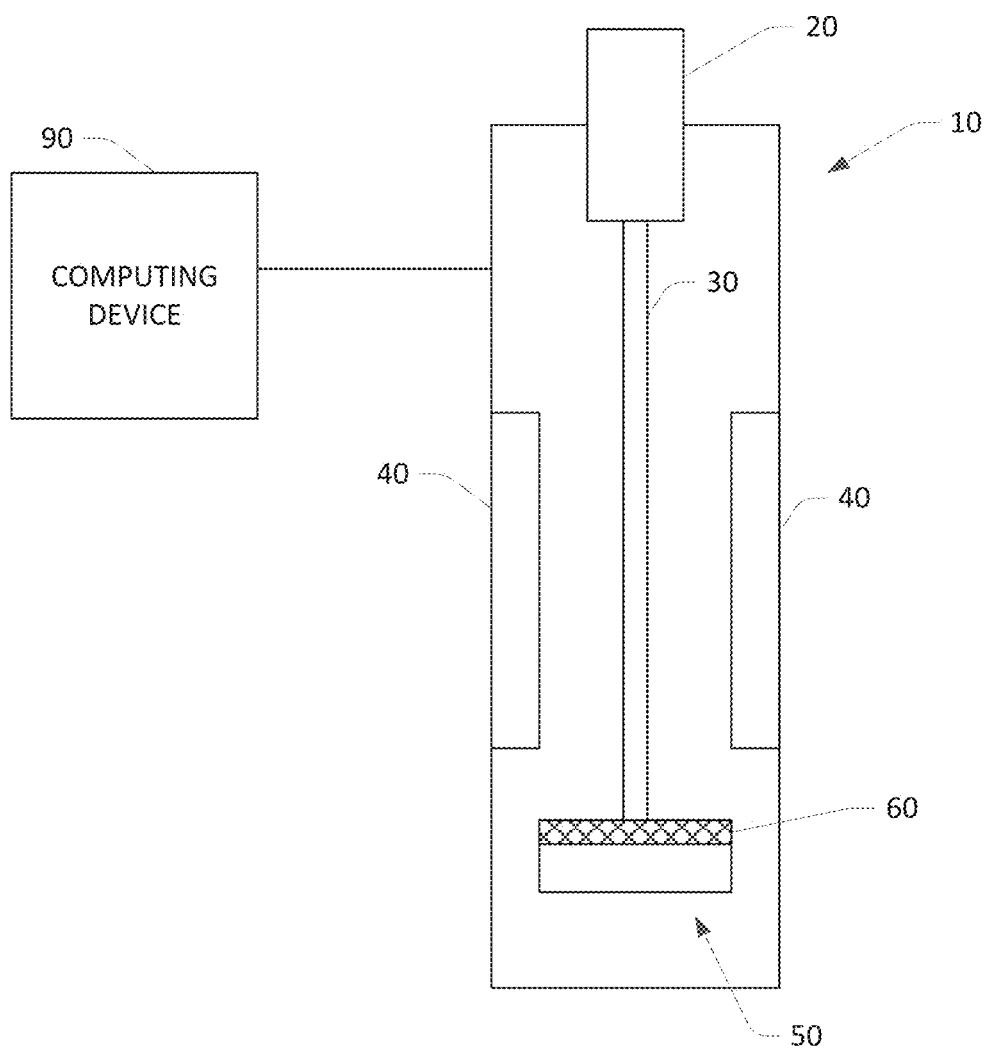
FIG. 1 is a schematic drawing of an embodiment of a scanning electron microscope (SEM).

A scanning electron microscope (SEM) is an example of an electron microscope. FIG. 1 shows a simplified schematic view of an SEM. The SEM includes a column 10 that houses several components. An electron gun 20 that emits an electron beam 30 is disposed at an end of the column 10. One or more scan coils 40 are disposed along the interior of the column 10, and these function to deflect the electron beam 30 onto a sample area 50, thereby controlling where the beam contacts the sample area 50. During data gathering operations, the sample area 50 includes a sample 60 disposed thereon for analysis. At least a portion of the sample area 50 and sample 60 are divided into pixel locations that may be described and x and y coordinates on a two-dimensional grid.

Components of the column 10 including the electron gun 20 and the coil 40 are coupled to a computing device 90. The computing device 90 is further described below in reference to FIG. 5.

It is to be understood that this is a simplified description of an SEM that is provided for explanatory purposes of the components and methodologies described herein in greater detail. Other common components are not shown, such as detectors, a power source, condenser lenses and apertures, and an air lock and pump for the sample chamber, but their locations and function are to be understood.

In a scanning probe microscope embodiment, a physical probe (such as a needle), rather than an electron beam, scans across the sample area surface. There are other differences between electron and scanning probe microscopes, which will be readily appreciated.

Other examples of electron microscopes include transition electron microscopes (TEM), reflection electron microscopes (REM), scanning optical microscope (SOM), and scanning transmission electron microscopes (STEM). In another embodiment, the method is applicable to other domains of nanometer microscopy in which speed is a limiting factor, including scanning probe microscopy, such as atomic force microscopes (AFM) and scanning tunneling microscopes (STM).

Figure 2:
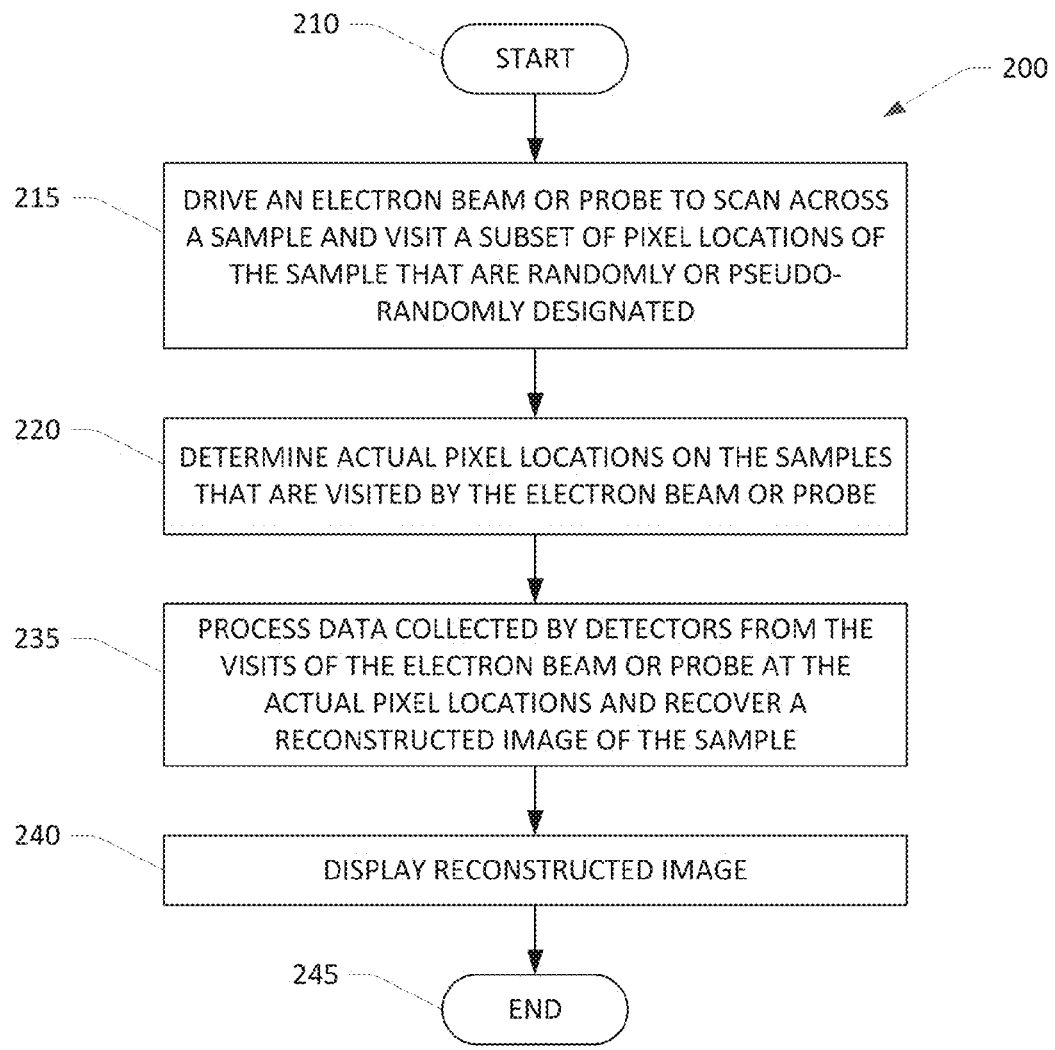
FIG. 2 shows an exemplary method for conducting electron or scanning probe microscopy.
Figure 2A:
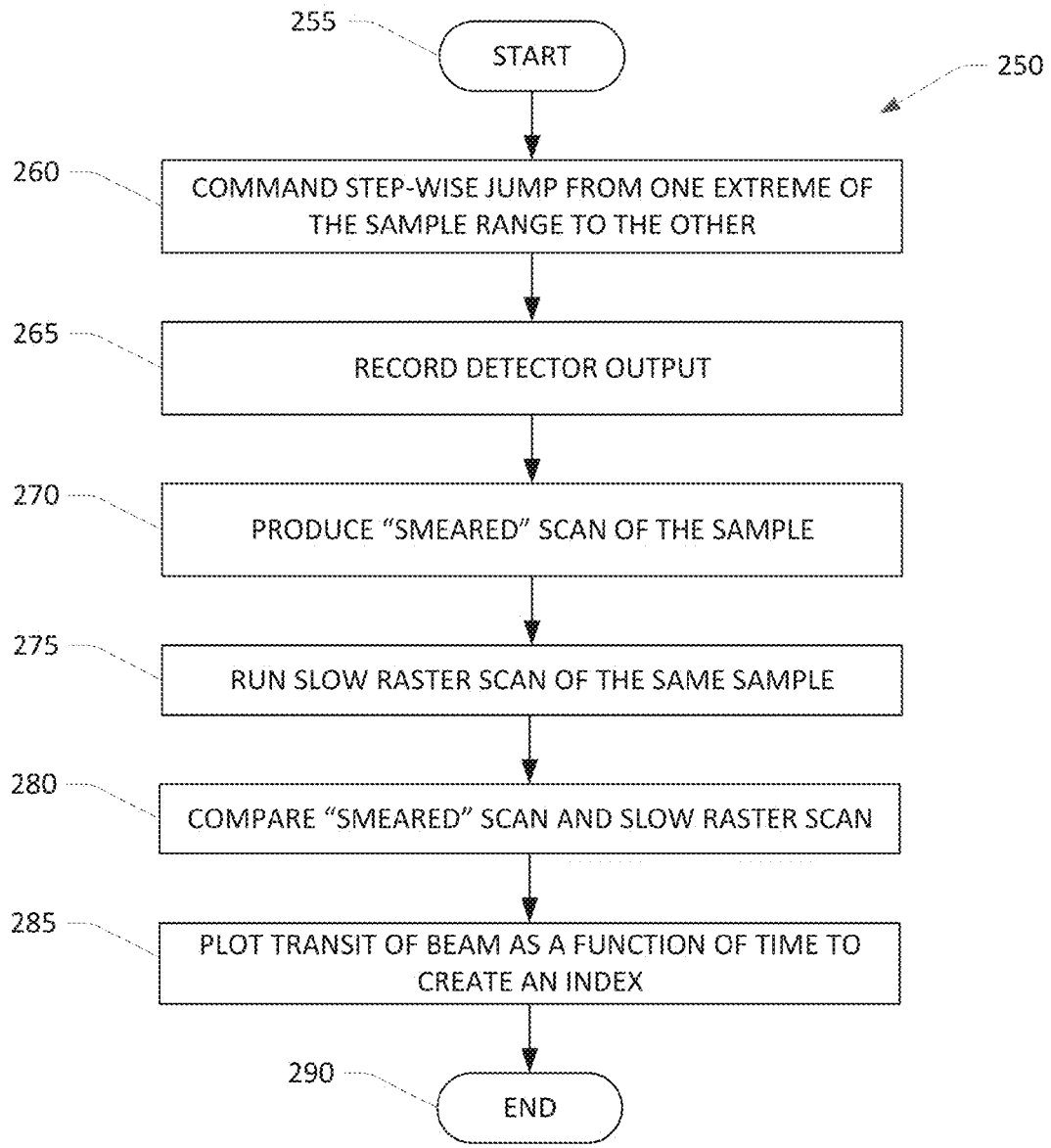
FIG. 2A shows an exemplary method for conducting a calibration for an electron or scanning probe microscope.

FIGS. 2 and 2A illustrate exemplary methodologies relating to electron and scanning probe microscopy. While these methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Moreover, the acts described herein may be computer-executable instructions that can be implemented by one or more processors and/or stored on a computer-readable medium or media. The computer-executable instructions may, for example, include a routine, a sub-routine, programs, and/or a thread of execution. Still further, results of acts of the methodologies may, for example, be stored in a computer-readable medium and/or displayed on a display device.

Referring now to FIG. 2, a methodology 200 that facilitates electron or scanning probe microscopy is illustrated. The methodology 200 begins at 210, and at 215 an electron beam or probe is driven to scan across a sample and visit a subset of pixel locations of the sample that are randomly or pseudo-randomly designated. The random sampling may, for example, be computed by a processor in real-time and stored or the sampling may be directed by pre-computed random values. In an embodiment, the full set of pixel locations comprises the sample area that is occupied by the sample itself. The number of pixel locations for a given sample area may be preset or determined by an operator, within the resolution limits of the particular microscope. Typically, the probe interaction area on a sample is much smaller than the distance between pixel locations.

In an embodiment, the dwell time is variable at each location and is a function of the random selection of pixels. Alternatively, the dwell times can be set to a given value required for achieving a desired signal-to-noise ratio (SNR). In general, the methodology 200 does not require increased dwell times to substantially maintain SNR, nor does it require decreased dwell times to provide the speed up in analysis.

In an embodiment, the dwell time is set, for example, 0.1 to 100 microseconds, such as 1 microsecond to 10 microseconds or 3 microseconds to 8 microseconds at each pixel location. Depending on the instrument used and other settings, the selected dwell time may equate to 1 to 100 samples at each random selected pixel location, such as 5 to 50 samples, or 10 to 25 samples. In an embodiment, the beam or probe continuously samples as it is in transit to the next pixel location. The result is that the dwell time for a selected pixel or the number of samples per pixel are actually distributed across multiple pixel locations as the electron beam or probe is in transit to the next pixel location of the randomly selected subset. It is a challenge, however, to know the actual location of the probe in transit while the sampling is performed. This may be determined however as explained below.

The random or pseudo random sampling of step 215 is in contrast to traditional electron microscope methodologies, where imaging rates are physically constrained because the probe (probe meaning an electron beam or physical probe structure) visits each pixel location in raster-scan order. As the probe or electrons in the incident beam interact with the sample, various signals are produced providing information about the composition or topography of the sample surface. These signals are detected and digitally assigned to the image pixel value at the corresponding sample location. The electron probe is then repositioned, for example, via electromagnetic or electrostatic deflection to a subsequent pixel location.

In an embodiment, the scanning speed of the beam or probe, that is the speed at which the beam moves from one pixel to the next, is increased by at least 1.5 times faster than the typical microscope setting, for example, 2 times faster to 12 times faster, or 3 times faster to 5 times faster. For example, the beam or probe may have a scan speed of from 0.05 pixels/microsecond to 100 pixels/microsecond, such as 10 nm/microsecond to 50 nm/microsecond, or 60 nm/microsecond to 90 nm/microsecond.

In an embodiment, rather than scanning each pixel location of the sample, the electron probe is commanded to visit a smaller subset of pixel locations, for example, 10% to 50%, 30% to 50%, or 15% to 40% of the sample locations. A speed up in total analysis time will be realized proportionately to the sample locations. For example, a 2× speed-up corresponds to an analysis of a 50% subset of pixels and a 10× speed-up corresponds to analysis of 10% of the pixel locations. If a sample has high contrast and/or large areas that are the same, it is more compressible. Accordingly, in such samples a lower subset of pixels can be analyzed and a higher speed up can be obtained.

In an embodiment, the electron beam or probe may be commanded to visit or sample one half or fewer of the total number of pixel locations of a sample area, for example, one-third to one-tenth or one fourth to one-sixth of the total number of pixel locations.

The locations visited, although random or pseudo-randomly selected, may, for example, be visited in an order that follows the typical movement of the microscope beam or probe, such as vertical or horizontal raster order.

In an embodiment, the electron beam or probe is moved around the sample by providing a set of voltage signals to the scan coils. These voltage signals differ from the traditional signals that command the beam or probe to move around the sample in raster order. Rather, the voltage signals are varied to direct the beam or probe to provide the random or pseudo-random pattern of visitation and analysis.

In an embodiment, a hardware or software component acts as a randomizer to modify the driving of the probe or beam. For example, the component could be a computer or a custom ASIC or FPGA that sends a signal to the microscope. In an embodiment, a control algorithm drives hardware to create voltage patterns and those voltage patterns are transmitted to the scan coils of the microscope. In a small integrated system embodiment, random voltage pattern codes could be pre-stored and built into the hardware system.

In an embodiment, the driving of the beam or probe can be combined with a mechanical mechanism to move the sample itself in relation to the beam or probe. In an embodiment, the electrical and mechanical movement can be integrated with the beam or probe movement to examine a large sample. For example, once the full scope of the subset of pixels of the normal sample area is randomly analyzed by the beam or probe, a stage on which the sample is set may be mechanically moved to put an adjacent section of the sample in the scope of the beam or probe for further random sampling.

Turning again to FIG. 2, the methodology 200 continues at step 220, which comprises determining actual pixel locations on the sample that are visited by the electron beam or probe.

Part of the challenge encountered with only randomly sampling as opposed to sampling every location in raster-scan order is that it may be difficult to know where the exact actual sampling locations are, and this uncertainty makes it difficult to accurately reconstruct the image. This is particularly true where the sampling is distributed over several locations while the beam or probe is scanning. This is not a problem with conventional full pixel set raster scanning where there is continued motion in one direction at a constant speed. In raster-scanning this is accounted for by starting the beam moving in one direction and when it reaches a constant speed, only then does data collection begin. Thus, the beginning of each row of the sample area is not collected or analyzed. By going at a constant speed and spending a set dwell time at every consecutive pixel there is no need for a detailed model of how the beam dynamics work.

However, in the sparse imaging methodology 200 utilized with electromagnetically driven beams or probes, the interval between randomly-selected pixel locations within a scan line is highly variable, so that the effect of the dynamics is pronounced, and the measured location may differ greatly from the desired location. Any time there is a change in the motion, there is a nonlinear response by the beam. In an SEM embodiment, the beam is deflected with two or more sets of electromagnetic coils, at least one for each scan direction. The current driven through these coils creates a magnetic field that deflects the moving electrons as they travel down the column. In addition to the inductance in the coils, stray capacitance and wire resistance creates a dynamic system which cannot respond instantaneously to changes in current. Additionally, the amplifiers used to drive the coils exhibit a non-negligible dynamic response. The combination of these systems creates a non-trivial dynamic system that can affect signals with frequency content as low as tens or hundreds of kHz. As a result, the actual location of the beam is often not the same as the commanded location, which creates image distortion unless some compensation is done.

Certain systems, such as electrostatic coil SEMs, do not typically suffer from the nonlinear response issues of electromagnetically driven systems. Accordingly the determining step may be straightforward in such systems, that is, the expected location will equate to the actual location, and the determining step may be skipped.

In an embodiment, in order to determine actual pixel locations on the sample that are visited by the electron beam or probe, a calibration step is performed for calibrating the microscope to account for beam dynamics. The calibration is performed to predict where the beam actually is at a given point in time during transit of the beam. In general, the information on where the beam is commanded to be is recorded, the actual measurement of a known sample at that point is detected and recorded, and then using that information, an index is created to determine the actual pixel location that is being visited and analyzed by the detector as a function of time. In an embodiment, the calibration may be performed at a variety of magnifications and speeds.

The index created is employed in the determining step 220 to modify the commanded location of the beam to correspond to the actual pixel location of the beam when a given measurement is taken. The determining may be done in real time, during the sample analysis, or after the sample analysis is complete.

In an embodiment, determining of the actual location is based on at least a 5th-order dynamical model shown in Equation (1).

$$\frac{d^5 x(t)}{dt^5} = \alpha_0(\hat{x}(t) - x(t)) - \alpha_1 \frac{dx(t)}{dt} - \alpha_2 \frac{d^2 x(t)}{dt^2} - \alpha_3 \frac{d^3 x(t)}{dt^3} - \alpha_4 \frac{d^4 x(t)}{dt^4} \quad (1)$$

where x(t) is the true one-dimensional probe position (in pixels) at time t, $\hat{X}(t)$ is the desired position, and $\{a_0, \ldots, a_4\}$ are the best-fit parameters. To predict the actual location of the electron probe, a 4/5 Runge-Kutta method may be used to solve Equation (1). An example of the processing step on an actual SEM sparse sampled data is included below in the Examples section, which includes specific values for the best-fit parameters.

At step 235 of the methodology 200 shown in FIG. 2, processing of the data collected by the microscope detectors from the visits of the electron beam or probe at the actual pixel locations is performed, and through this, the reconstructed image of the sample is recovered.

In an embodiment, the image is reconstructed from the sparse pixel data through interpolation plus denoising using block-DCT with total variation regularizer. These calculations are described in detail below. The degrees of freedom of typical electron microscope images are many fewer than the number of image pixels. Foundational contributions in compressed sensing guarantee that an N-pixel image x, which can be described by K coefficients in some compression basis Ψ, can be exactly recovered in only M=O(K log N/K) linear measurements of the form y=Φx. The tightest guarantee to date holds when A=ΦΨ satisfies the restricted isometry property, which guarantees recovery using basis pursuit:

$$\min_x \|\Psi^T x\|1 + \|\nabla x\|_1$$
$$\text{s.t.} \|y - \Phi x\| \leq \sigma^2$$

It should be noted that for arbitrary A, certifying that the restricted isometry property holds is combinatoric in M. Although mutual coherence μ(ΦΨ) provides a looser guarantee on reconstruction from M=0 (μKlogN)) measurements, it is trivial to compute.

In view of this, in an embodiment, noise and compression of the sparse sample data may be dealt with by the following approach. After M<N measurements are collected (M=O(μKlogN) and N is the number of image pixels), regularized basis pursuit denoising is performed to recover the image from the compressed random sampling data. It is assumed that each measurement is corrupted by white noise with noise power σ2. It is assumed that each measurement is corrupted by white noise with noise power $\sigma^2$. A measurement model, based on sparsely sampled elements y=Φx+n, may be used, where n is the additive noise with $E[nn^T]=\sigma^2 I$, Φ represents a randomly selected subset of pixels (subset of rows of identity), and I is the identity matrix.

From the M<N measurements, the image can be reconstructed via $$\min_x \|\Psi^T x\|1 + \|\nabla x\|_1 \tag{2}$$
$$\text{s.t.} \|y - \Phi x\| \leq \sigma^2$$

Where the compression basis, Ψ is chosen to be block-DCT in this case with 32×32 pixel blocks. Block DCT may be chosen because it provides good compressibility of SEM images and has low mutual coherence with the sampling scheme. The total-variation regularizer ⌊∇x⌋ 1 is equal to (3):

$$\Sigma_i \sqrt{|(\nabla_h x)_i|^2 + |(\nabla_v x)_i|^2} \tag{3}$$

and is employed to denoise the image and to promote smoothness between block boundaries in the block-DCT.

Equation (2) can be solved by applying a basis pursuit recovery algorithm utilizing compressibility of the acquired image data for recovering the reconstructed image. For example, this may be accomplished through the split Bregman method by T. Goldstein and S. Osher, described in "The Split Bregman Method for L1-regularized Problems," SIAM Journal on Imaging Sciences 2(2), 323-343 (2009) (Goldstein and Osher), which is incorporated herein by reference. By using the Bregman iteration, the solution of the unconstrained problem will converge to the solution of the constrained problem in (2) by iteratively solving for an intermediate solution to the problem, then updating the so-called Bregman parameters, which add the error back in. The equations and method below are exemplary.

$$\min_x \|\Psi^T x\|_1 + \|\nabla x\|_1 + \frac{\mu}{2}\|y - \Phi x\|_2^2 \quad \text{(unconstrained problem)}$$

The compressed sensing MRI derivation in Goldstein and Osher can be followed, noting that the present problem structure differs since image-domain samples are collected rather than Fourier-domain samples. The split Bregman formulation is applied so that the problem can be solved iteratively to arbitrary precision. In particular, at the kth iteration, the following equation may be solved:

$$\min_{x,u,v,w} \|w\|_1 + \|(u,v)\|_2 + \frac{\mu}{2}\|\Phi x - y\|_2^2 + \tag{4}$$
$$\frac{\lambda}{2}\|u - \nabla_u x - b_u^k\|_2^2 + \frac{\lambda}{2}\|v - \nabla_v x - b_v^k\|_2^2 + \frac{\gamma}{2}\|w - \Psi^T x - b_w^k\|_2^2,$$

where $w=\Psi^T x$, $u=\nabla_u x$ (horizontal gradient), $v=\nabla_v x$ (vertical gradient) and shorthand $$\|(u,v)\|_2 = \Sigma_i \sqrt{|u_i|^2 + |v_i|^2}. \tag{5}$$

The so-called Bregman parameters are then updated via the three equations below.

$$b_u^{k+1} = b_u^k + (\nabla_u x^{k+1} - u^{k+1}) \tag{6}$$

$$b_v^{k+1} = b_u^k + (\nabla_v x^{k+1} - v^{k+1}) \tag{7}$$

$$b_w^{k+1} = b_w^k + (x^{k+1} - u^{k+1}) \tag{8}$$

The auxiliary variables w, u, and v, represent the DCT coefficients, the horizontal gradient, and the vertical gradient, respectively, of the image. The merit in the "split" Bregman formulation is that the $I_1$ and $I_2$ portions have been decoupled, allowing a simple solution via alternating minimizations using element-wise shrinkage. See the equations below:

$$u_i^{k+1} = \frac{\max\left(s_i^k - \frac{1}{\lambda}, 0\right)}{s_i^k}((\nabla_u x^k)_i + b_{u,i}^k)$$

$$v_i^{k+1} = \frac{\max\left(s_i^k - \frac{1}{\lambda}, 0\right)}{s_i^k}((\nabla_v x^k)_i + b_{v,i}^k)$$

$$w_i^{k+1} = \text{shrink}\left((\Psi^T x^{k+1})_i + b_{w,i}^k, \frac{1}{\gamma}\right) \text{ where}$$

$$s_i^k = \sqrt{|(\nabla_u x^k)_i + u_i^k|^2 + |(\nabla_v x^h)_i + v_i^k|^2} \text{ and}$$

$$\text{shrink}(x, \rho) = \text{sgn}(x)\max(|x| - \rho, 0).$$

To solve (4) for x, however, one approach is to use a system of equations that includes a circulant (μΦTΦ) plus diagonal (λΔ+γI). For example, solving (4) for xk+1 yields:

$$(\mu\Phi^T\Phi - \lambda\Delta + \gamma I)x^{k+1} = \mu\Phi^T y + \lambda\nabla_u^T(u^k - b_u) + \lambda\nabla_v^T(v^k - b_v) + \gamma\Psi(w^k - b_w), \tag{9}$$

This assumes that $\Psi^T\Psi$, and uses $\Delta = -\nabla^T\nabla$ to represent the discrete Laplacian operator. Note that unlike the MRI example introduced in Goldstein and Osher, the system in (5) is not circulant since ΦTΦ is non-constant along its main diagonal. Therefore, the system cannot be diagonalized by the discrete Fourier transform to arrive at an exact solution. Nevertheless, as noted in Goldstein and Osher, an approximate solution to $x^k$ at each iteration suffices, since extra precision is wasted in the Bregman parameter update step. A few steps of the conjugate gradient method may suffice for arbitrary Φ, but for the special case in which Φ is a subset of the rows of identity, a more efficient approach was utilized. Indeed, it was found that the algorithm converges when approximating $\Phi^T\Phi$ as the nearest circulant matrix C, where nearness is measured in terms of the Frobenius norm ‖ΦTΦ−C‖F. This results in ΦTΦ≈C=aI, where a is the average of the elements along the main diagonal of ΦTΦ. The approximation error is bounded by ‖ΦTΦ−aI‖F=√N/2 at M=N/2. Employing the circulant approximation allows (9) to be solved efficiently using Fourier diagonalization.

An alternative method of solving includes the conjugate gradient method. However, by approximating the system as circulant, and solving for x using Fourier diagonalization, the overall algorithm converges, even though this step only provides an approximate solution. The basis pursuit denoising implementation is essentially jointly interpolating and denoising from the undersampled image data.

In summary, the above application of the split Bregman formulation for basis pursuit interpolation includes an inner loop that solves (2) via (6)-(8) and a circulant approximation to (5), and an outer loop that updates the Bregman parameters via (3)-(5). For typical images on the interval[0, 1], it was found that μ=λ=1 and γ=10−2 are reasonable values for reconstruction. In the implementation herein, two iterations of the inner loop, and 150 iterations of the outer loop for noiseless data were used, though 20-50 iterations are typically sufficient to produce high-quality reconstructions.

Once the processing and recovering step 235 is completed or at least partially completed, the processed and recovered image or partial image is displayed in a displaying step 240. For example, the image may be displayed through an output device, such as a monitor or printer. The methodology 200 completes at 245.

With reference to FIG. 2A, an exemplary methodology 250 for performing the above-referenced calibration is illustrated. The methodology 250 begins at 255, and at 260, in order to model the dynamics of the system, including the effects of the amplifiers and scan coils of the system, a stepwise jump in position from one extreme of the beam's scanning range to the other over a calibration sample is commanded. For example, the two extremes may be at opposite extremes in a horizontal row across the calibration sample. At 265, while the electron beam is in transit across the sample, the output of the secondary electron detector is recorded. At 270, this step-scanning routine produces a "smeared" scan of the sample. At 275, a standard slow raster scan of the same sample is performed across the same extremes of the sample. The beam in the two scans is run in the same direction, for example, horizontally left-to-right. At 280, a comparison of the "smeared" scan and the slow raster scan is performed. At 285, using the comparison data, the transit of the beam is plotted as a function of time to create an index that reflects the beam dynamics. (See also Example 5 below).

Figure 3:
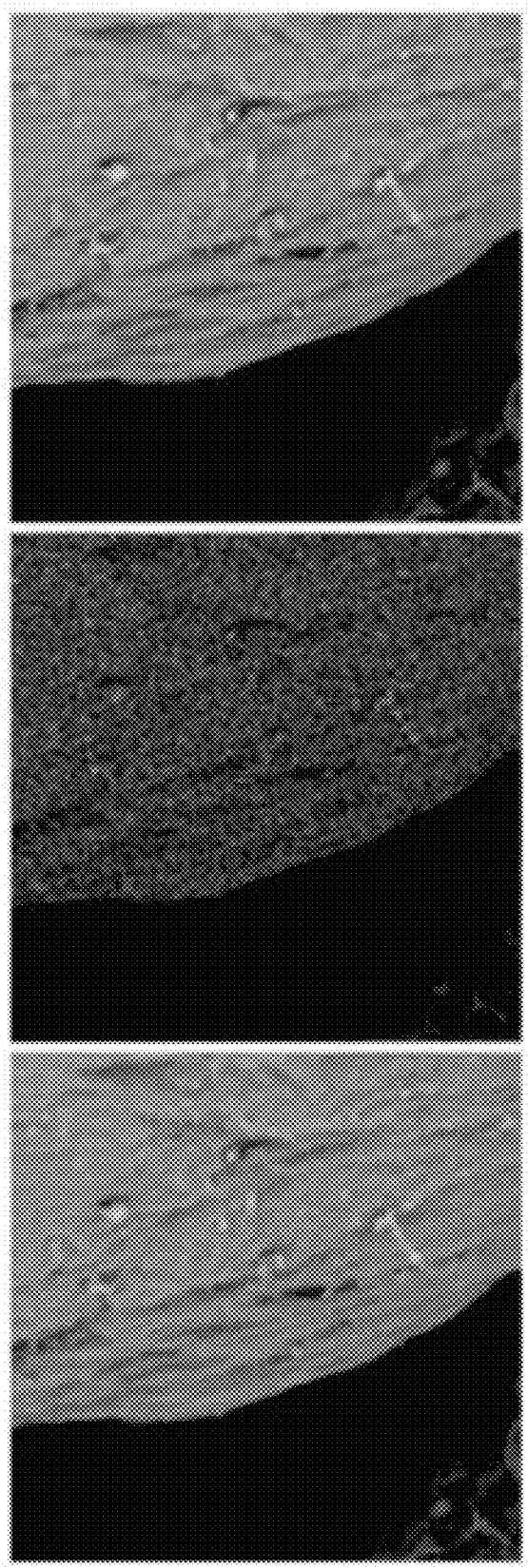
FIG. 3 is an SEM monograph of Amorphophallus titanium pollen (left), with simulated 50% undersampling (center), and a reconstruction using block-DCT as a sparsifying basis (right).

FIG. 3 shows an example reconstruction from M=N/2 randomly selected samples of an excised 512×512 block from an SEM monograph of Amorphophallus titanium pollen (left panel). The center panel shows a simulated 50% random undersampling. The right panel shows a reconstruction using the above processing method with block-DCT as a sparsifying basis (PSNR is 36 dB).

The sparse imaging methodology 200 is capable of achieving efficient data collection at the expense of greater off-line computation. Moreover, the methodology 200 may still require an order of magnitude more time to reconstruct the image than was required to collect the data. The greater computation times may be acceptable, since, in contrast to data collection, image recovery may be distributed across many CPUs.

Figure 4:
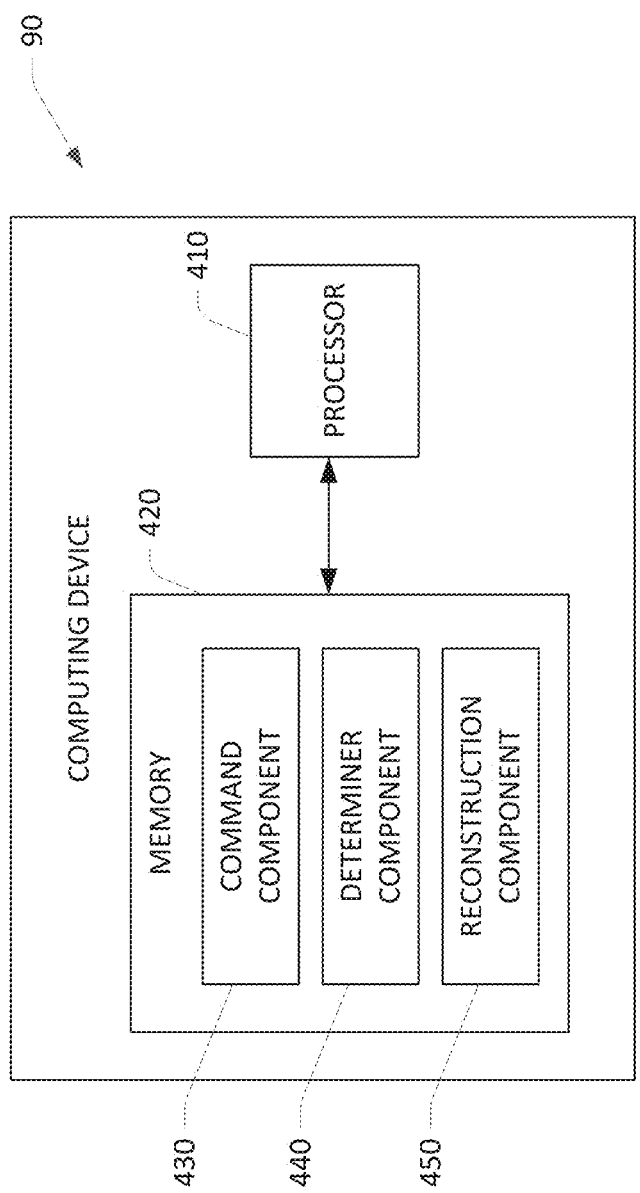
FIG. 4 shows an exemplary electron microscope imaging system.

Referring now to FIG. 4, in an embodiment, the computing device 490 includes or is coupled to a processor 410 and a computer-readable memory 420 (which may be memory or a data store) that comprises a plurality of components that are executed by the processor 410. The computing device 90 can be configured to execute the methodology 200 described herein.

A command component 430 is configured to command an electron beam or probe to scan across a sample area and visit a subset of desired pixel locations of the sample area. The subset of desired pixel locations may be designated in a random or pseudo-random manner. A determiner component 440 is configured to determine actual pixel locations on the sample area that are visited by the electron beam, and a reconstruction component 450 is configured to process data collected by detectors from the visits of the electron beam at the actual pixel locations and recover a reconstructed image from the processed data.

In an embodiment, the computing device 90 is part of a system that includes input and output devices, and in an embodiment, the functionalities of one or more of the components, particularly the reconstruction component 450, are executed across a distributed series of multiple processors.

In an embodiment, the computing device 90 comprises a small electronics hardware package that includes components to do analog to digital conversion and digital to analog conversion, and a processing unit to control the values. Software to execute the sparse sampling methodology 200, may be either implemented on the hardware package or on a remote computer that is connected to the hardware package. The remote computer, for example, may perform the data processing or just the computational intensive tasks associated with the iterative reconstruction process. In an embodiment, the computing device comprises electronics hardware for generating random or pseudo-random sampling patterns.

In an embodiment, the methodology 200 may be implemented as software on a computing device that is coupled to an electron or scanning probe microscope and also executes instructions for operating the microscope.

Figure 5:
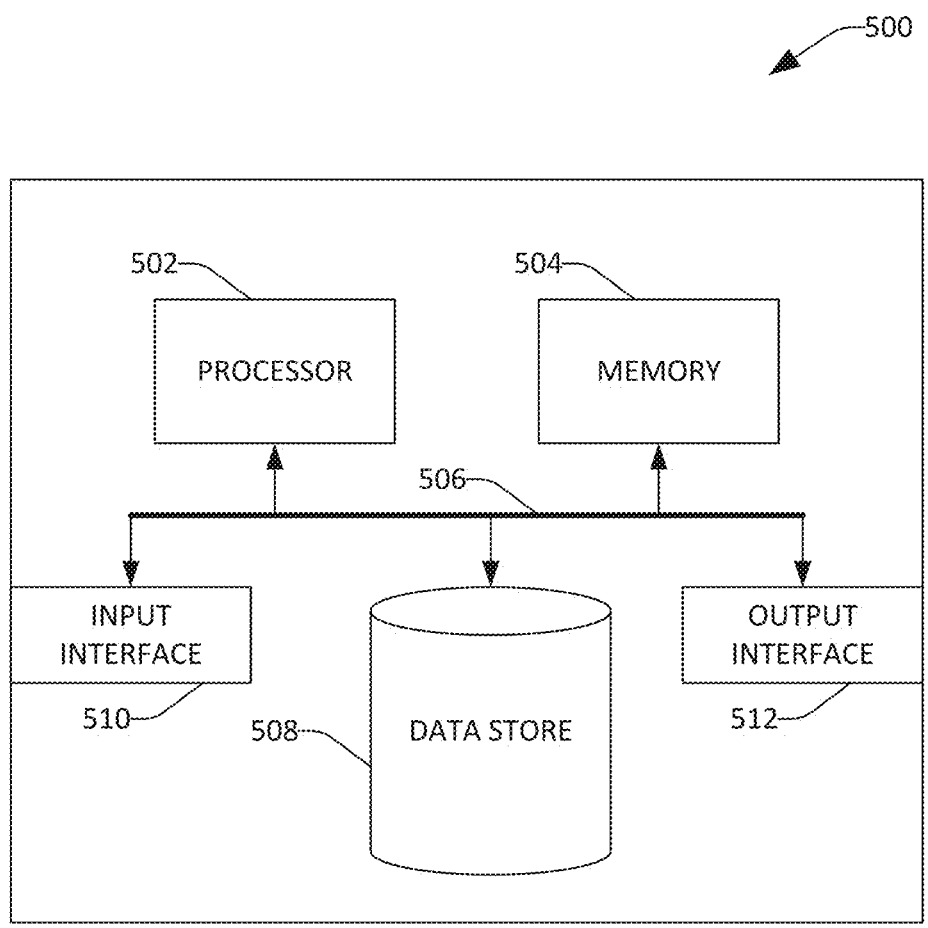
FIG. 5 shows an exemplary computing device that can be used in accordance with the systems and methodologies disclosed herein is illustrated.

Referring now to FIG. 5, a high-level illustration of an exemplary computing device 500 that can be used in accordance with the systems and methodologies disclosed herein is illustrated. The computing device 500 includes at least one processor 502 that executes instructions that are stored in a memory 504. The instructions may be, for instance, instructions for implementing functionality described as being carried out by one or more components discussed above or instructions for implementing one or more of the methods described above. The processor 502 may access the memory 504 by way of a system bus 506. In addition to storing executable instructions, the memory 504 may also, for example, store random or pseudo randomly selected pixel locations or voltages for driving a beam to such pixel locations, data received from the detectors of the electron or scanning probe microscope, and algorithms used in executing the determining and processing steps mentioned above.

The computing device 500 additionally includes a data store 508 that is accessible by the processor 502 by way of the system bus 506. The data store 508 may include, for example, executable instructions, random or pseudo randomly selected pixel locations or voltages for driving a beam to such pixel locations, data received from the detectors of the electron or scanning probe microscope, and algorithms used in executing the determining and processing steps mentioned above. The computing device 500 also includes an input interface 510 that allows external devices to communicate with the computing device 500. For instance, the input interface 510 may be used to receive instructions from an external computer device, from a user, etc. The computing device 500 also includes an output interface 512 that interfaces the computing device 500 with one or more external devices. For example, the computing device 500 may display text, images, etc. by way of the output interface 512.

It is contemplated that the external devices that communicate with the computing device 500 via the input interface 510 and the output interface 512 can be included in an environment that provides substantially any type of user interface with which a user can interact. Examples of user interface types include graphical user interfaces, natural user interfaces, and so forth. For instance, a graphical user interface may accept input from a user employing input device(s) such as a keyboard, mouse, remote control, or the like and provide output on an output device such as a display. Further, a natural user interface may enable a user to interact with the computing device 500 in a manner free from constraints imposed by input device such as keyboards, mice, remote controls, and the like. Rather, a natural user interface can rely on speech recognition, touch and stylus recognition, gesture recognition both on screen and adjacent to the screen, air gestures, head and eye tracking, voice and speech, vision, touch, gestures, machine intelligence, and so forth.

Additionally, while illustrated as a single system, it is to be understood that the computing device 500 may be a distributed system. Thus, for instance, several devices may be in communication by way of a network connection and may collectively perform tasks described as being performed by the computing device 500.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionally described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

EXAMPLES

By way of example and not limitation, the following examples are illustrative of various embodiments of the present disclosure.

The sparse sampling method was demonstrated with public domain SEM images and on an operational SEM. As shown in the Examples below, acceptable image quality was achieved at 3× speedup. This was accomplished by commanding the electron probe to visit a randomly-selected subset of pixel locations, predicting the actual locations via a 5th-order dynamical model, then recovering the image using a split-Bregman formulation of regularized basis pursuit that leveraged block-DCT as a compression basis.

Example 1

To assess image sparsity of typical electron microscopy images, 1,022 electron microscopy images (SEM, TEM and E-SEM) were obtained from the Dartmouth public domain gallery. The images are of a variety of different specimens in biology, geology, and materials, and include a wide range of magnifications and image sizes. To standardize analysis, the center 512×512 of each image was excised to remove banners and rescaled images to [0; 1] grayscale values. For each 512×512 image, the sparsity K was computed by counting the number of large coefficients in the block-DCT domain (32× 32 blocks) that accounted for at least 99.75% of the total coefficient energy.

Figure 6:
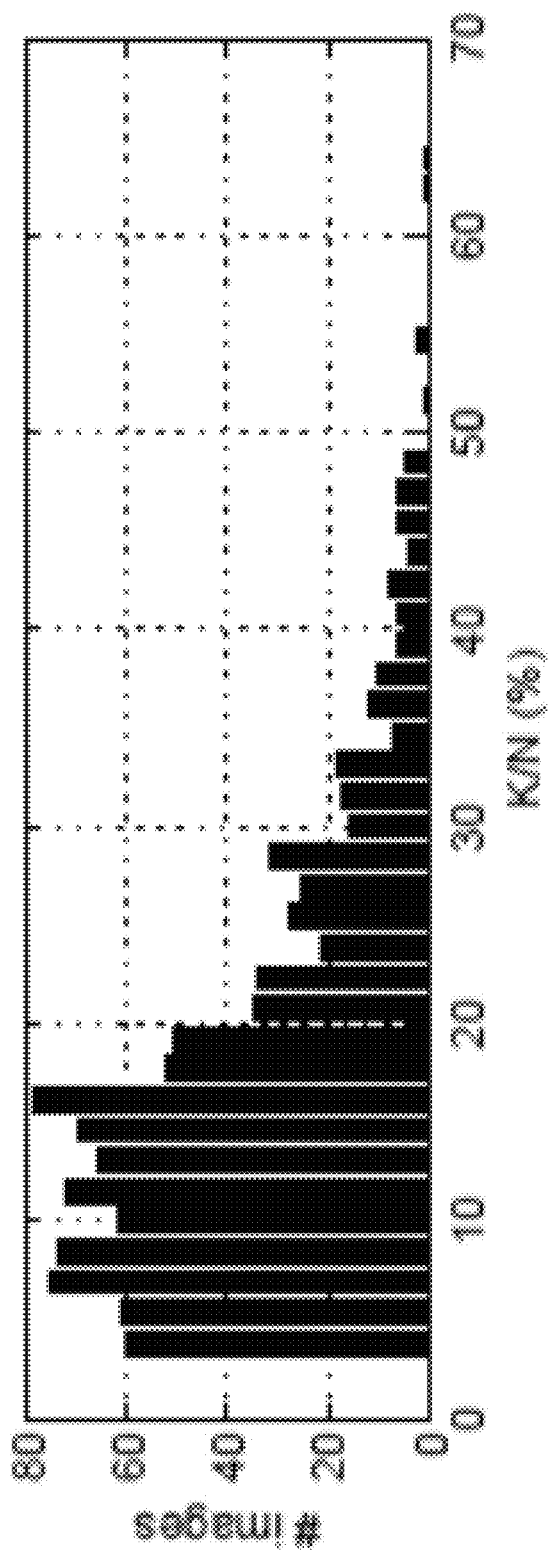
FIG. 6 is a histogram of the sparsity of the Dartmouth public electron microscopy images.

FIG. 6 shows a histogram of the sparsity of the Dartmouth public electron microscopy images, where sparsity is measured by counting the number of block-DCT coefficients K that account for at least 99.75% of the image energy. The average sparsity is 17%, with half of all images less than 15% sparse, and three-quarters less than 20% sparse.

This suggests that by applying compressed sensing, most SEM images could be acquired with compressed measurements with about 20-40% reduction in the number of samples, with little or no information loss.

Example 2

Using the proposed recovery method in equation (1) (see above), reconstruction of the public domain Dartmouth images analyzed in Example 1 was simulated from sparse samples. For each 512×512 excised and standardized image x, sparse sampling was simulated by choosing M pixels at random from the image, where M/N is swept from 10% to 100%. Then, the images were reconstructed using both the basis pursuit approach and bilinear interpolation approach described above for comparison purposes.

Figure 7:
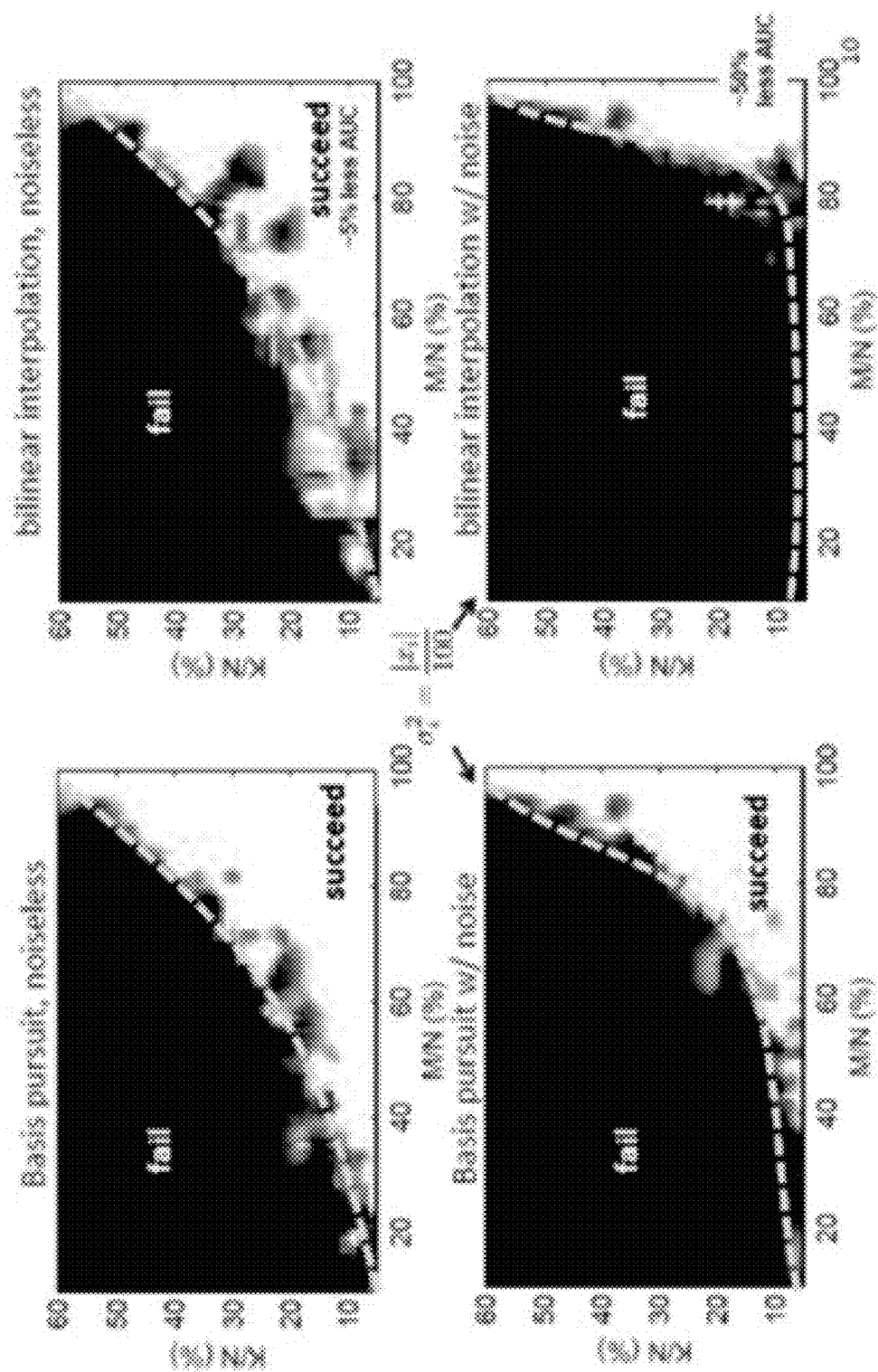
FIG. 7 is a series of graphs comparing basis pursuit image reconstruction and bilinear interpolation image reconstruction both with and without noise.

FIG. 7 shows the results of this comparison. The top panels show calculations without noise, and the bottom panels were calculated with introduced noise. (Noise was multiplicative: for pixel intensity η, zero mean white Gaussian noise was added with variance η/100).

The shading at each x/y location on the plot indicates how frequently an image with a given sparsity K/N was "successfully" reconstructed (accounted for at least 99.75% of the image energy) at a given undersampling rate M/N; the shading ranges from 0% (black) to 100% (white). The reconstructed image x^ was deemed a "success" if the following inequality were true:

$$\|x-\hat{x}\|_2^2/\|x\|_2^2 \leq 0.25\%$$

In other words, if the reconstruction accounts for at least 99.75% of the image energy, the image was "successfully" recovered.

It can be seen from the plots on the top panels, for noiseless reconstruction, basis pursuit and bilinear interpolation are approximately the same, with the phase transition between success and failure on the bilinear interpolation curve accounting for about 5% less area under the curve. However, when a very small amount of noise is added (multiplicative noise, in the case with variance 1/100 of the pixel intensity), bilinear interpolation breaks down quickly, with 50% less area under the curve compared to the basis pursuit denoising method.

Simple linear interpolation of the sparse sampled compressed images is both simple and very efficient. For example, the reconstruction in FIG. 3 (pollen sample), the basis pursuit approach took 18 seconds for 50 iterations using non-optimized MATLAB code with a 2.66 GHz Intel Xeon processor, whereas a similar reconstruction using MATLAB's griddata for linear interpolation took only 2 seconds. Thus, linear interpolation may be attractive as a "quick-look" option, but the proposed basis pursuit denoising method is preferred for high-quality reconstruction.

Example 3

Example 3 demonstrates on an operational SEM, the sparse sampling and recovery method for fast electron microscopy. The experiments were conducted using a commercially available SEM column with custom electronics to drive the beam location and sample the detector. A Zeiss GmbH (Oberkocken, Germany) column was used with a Schottky thermal field emission source and Gemini™ optics. A nominal beam energy of 10 keV was used with a 10 μm aperture, resulting in a beam current of approximately 200 pA.

The incident beam was deflected onto the sample using the standard scanning coils and current amplifiers in the column. However, custom electronics were used to set the desired beam location using an external scan mode. The magnification (and consequently the field of view) was set using the standard column controls. Once this was determined, pixels in the field of view were visited by driving a voltage of −10 V to +10 V, which is converted to a current in the coil amplifiers. For example, in the horizontal direction, driving −10 V would place the beam at the far left of the field of view and +10 V would place the beam at the far right. The same is true in the vertical direction.

A digital to analog converter (DAC) was used to drive the desired voltages by converting an digital signal from the computer to an analog signal that controls the scan coils. The detector was sampled using an analog to digital converter (A/D) that was synchronized to the DAC. The A/D and DAC were implemented using a National Instruments (Austin, Tex.) PCI-6110 multi-function data acquisition system. This system has a maximum frequency of 2.5 MHz with two analog outputs, an output resolution of 16 bits per sample and an input resolution of 12 bits per sample. DACs generally have a maximum "sample rate" at which they can update their command signals. This maximum rate can be considered one "sample." The amount of dwell time at any pixel must be an integer multiple of this sample time. Thus, if the beam was desired to dwell longer than the minimum sample time at one point, the DAC is commanded to hold a voltage for multiple samples. The effective dwell time (more dwell time means better SNR for that pixel) was then controlled by how many multiples of the basic sample time that the DAC was commanded to hold at each point. In this Example, variable dwell time was achieved by digitally averaging multiple samples at the same pixel location. A basic dwell time of 400 ns using one sample per pixel resulted in low-signal to noise ratio (SNR) images, while a high-SNR dwell time of 6.4 μs was achieved by averaging 16 samples per pixel.

Figure 8:
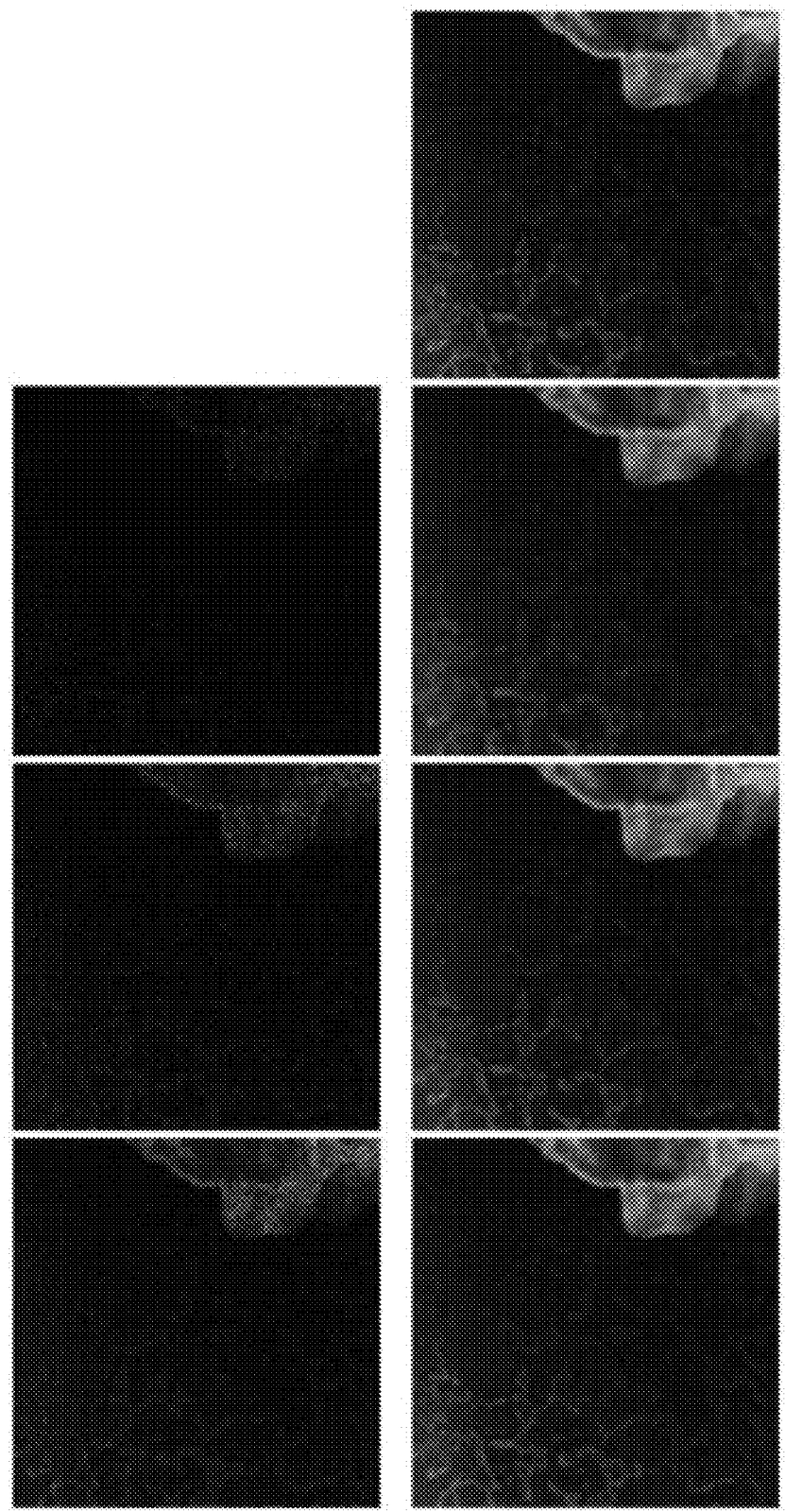
FIG. 8 is a series of SEM micrographs: (top row) an original section of a high-SNR micrograph from the SEM analysis of a particle atop the surface Gibeon meteorite slice; (2nd row) simulated 10% sparse samples (left) and reconstruction (right); (3rd row) simulated 30% sparse samples (left) and reconstruction (right); (4th row) simulated 50% sparse samples (left) and reconstruction (right).

A high-SNR image of the surface of a Gibeon meteorite collected in the manner just described is shown in FIG. 8, along with simulated sparse sampling and subsequent image recovery.

A digital command is created in a computer and this gets converted by a DAC to an analog signal that controls the scan coils. DACs generally have a maximum "sample rate" at which they can update their command signals. This maximum rate can be considered one "sample". The amount of dwell time at any pixel must be an integer multiple of this sample time. If we want the beam to dwell longer than the minimum sample time at one point, we command the DAC to hold a voltage for multiple samples. The effective dwell time (more dwell time means better SNR for that pixel because we average all the samples) is then controlled by how many multiples of the basic sample time we command the DAC to hold at each point.

FIG. 8 shows: (top row) an original section of a high-SNR micrograph from the SEM analysis of a particle atop the surface Gibeon meteorite slice; (2nd row) simulated 10% sparse samples (left) and reconstruction (right); (3rd row) simulated 30% sparse samples (left) and reconstruction (right); (4th row) simulated 50% sparse samples (left) and reconstruction (right).

It should be noted that on an operational SEM, nontrivial dynamics of the electron probe scanning system create a mismatch between the desired and actual measurement locations on the sample. The effect is less pronounced when visiting every pixel in typical raster-scan mode in which the electron probe follows the same trajectory during each scan line, and leads only to a nonlinear stretch of the image. However, as explained above, in the sparse imaging embodiment, the interval between randomly-selected pixel locations within a scan line is highly variable, so that the effect of the dynamics is pronounced, and the measured location differs greatly from the desired location.

Example 4

In Example 4, the sparse sampling method was utilized in an operational SEM. Mirroring Example 3, the electron probe was commanded to visit 10%, 30% and 50% of the sample locations chosen at random in vertical-raster order, and to dwell for 6.4 μs (16 samples per pixel) at each randomly selected pixel location. The result is that the 16 samples per randomly selected pixel are actually distributed across multiple pixel locations as the electron probe is in transit. To predict the actual location of the electron probe, a 4/5 Runge-Kutta method to solve Equation (1).

A portion of the Gibeon meteorite sample was imaged at 800× magnification at a working distance of 4.7 mm. Due to the close working distance, samples were collected with an in-lens secondary electron (SE) detector. Brightness and contrast for each sparse sampling collection was fixed at 76% and 41%, respectively.

Figure 9:
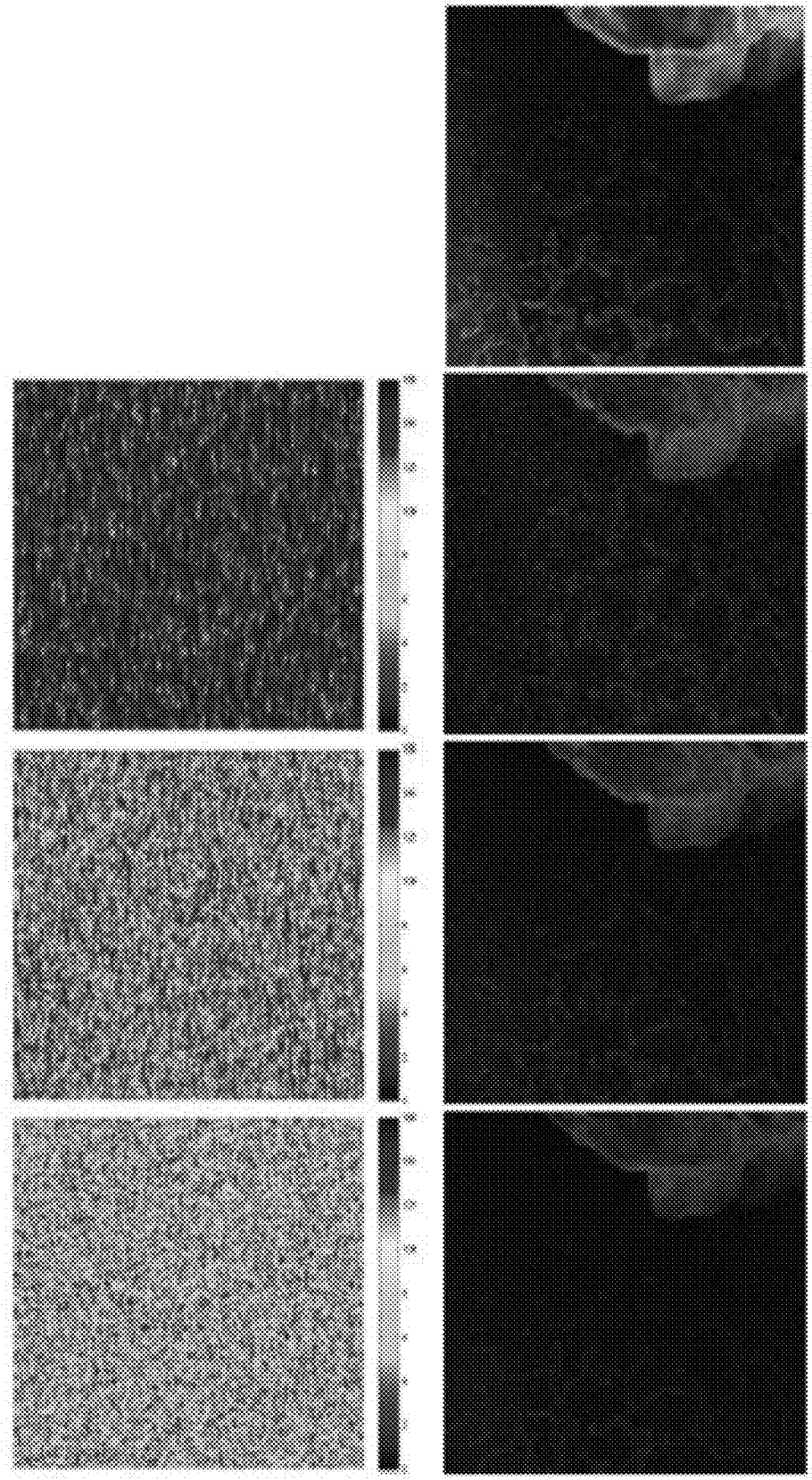
FIG. 9 is: (top row) a standard SEM image of the Gibeon sample; (2nd row) a 10% sparse (M/N=10%), modeled sample locations (left) and reconstruction (right); (3rd row) a 30% sparse, modeled sample locations (left) and reconstruction (right); (4th row) a 50% sparse, modeled sample locations (left) and reconstruction (right).

Results for the sparse sampling collection and reconstruction are shown in FIG. 9, which shows: (top row) a standard SEM image of the Gibeon sample; (2nd row) a 10% sparse (M/N=10%), modeled sample locations (left) and reconstruction (right); (3rd row) a 30% sparse, modeled sample locations (left) and reconstruction (right); (4th row) a 50% sparse, modeled sample locations (left) and reconstruction (right). The intensity of the gray-scale in the left column represents the number of times the probe visited the given pixel. The electron probe scanned vertically. In addition to sample quality, a difference in sample charging is also evident, which indicates that the sparse sampling method may be additionally useful for samples that are sensitive to overdosing.

For M/N=10%, the reconstruction exhibits some smearing along the vertical path of the electron probe, which can be attributed to large electron probe velocities and small errors in the 5th order model actual location prediction. Acceptable image reconstruction is achieved for M/N=30%, corresponding to a greater than 3× increase in image collection speed. Notice also that for smaller M/N, the lower average electron dose rates contribute to less charging on the sample (manifest by the slight glow on the left-hand side of the original image).

Example 5

A calibration routine was performed to characterize the dynamics of the amplifiers and scan coils. This was done by commanding a stepwise jump in position from one extreme of the beam's scanning range to the other over a calibration sample. While the electron beam was in transit, the output of the secondary electron detector was recorded. This step-scanning method produced a smeared scan of the sample.

Comparing this with a very slow raster scan of the same sample allowed plotting a beam location corresponding to the recorded output of the detector as a function of time.

Figure 10:
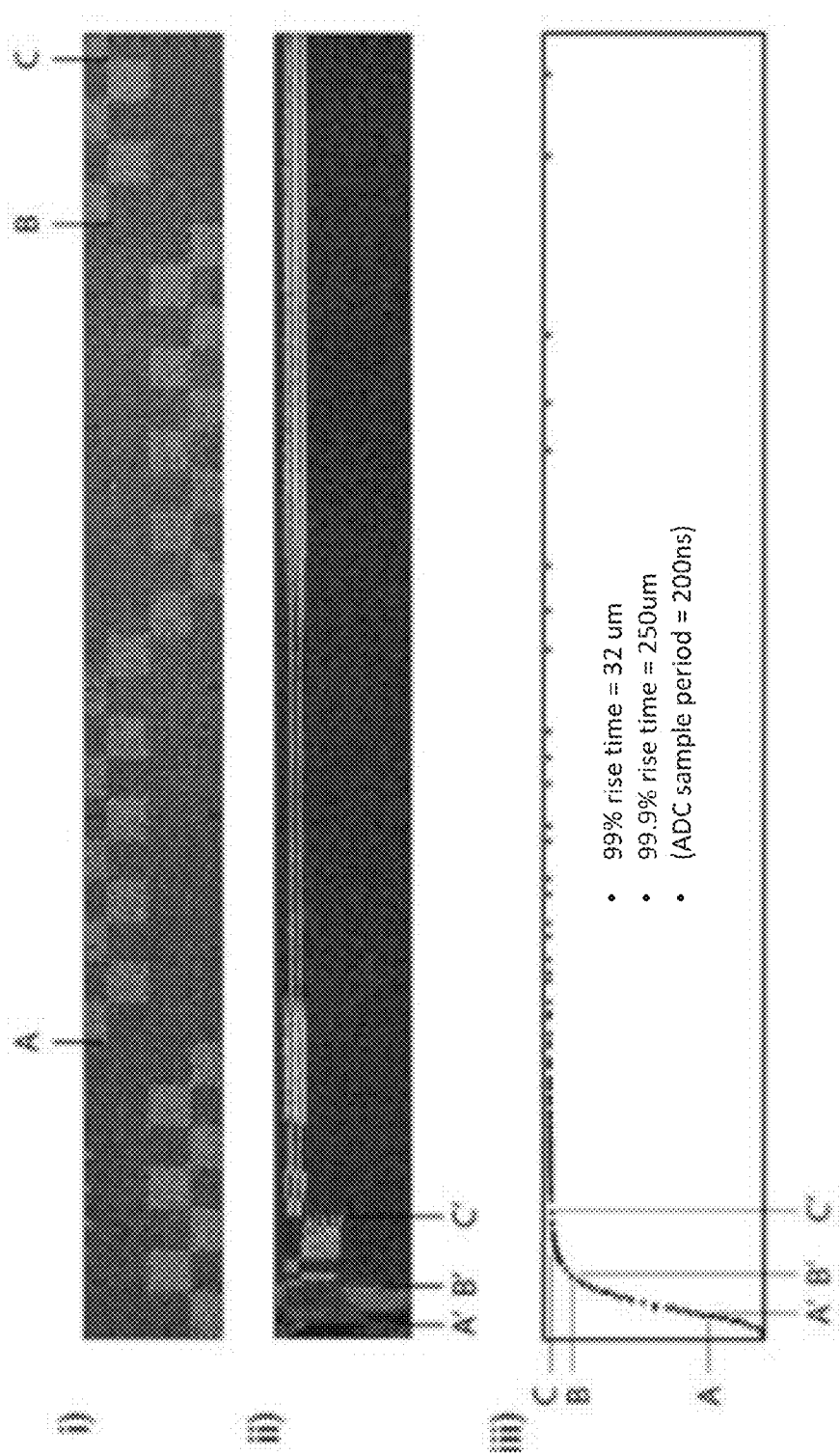
FIG. 10 shows: (panel i) a measurement of the scan coils dynamic response as a slow scan was performed; (panel ii) a measurement of the beam being stepped from one extreme of the scan range to the other while recording from the secondary electron detector; (panel iii) the positions of the landmarks plotted relative to each other to obtain data points along the step response curve.

FIG. 10 shows a measurement of the scan coil's dynamic response. Panel i) shows a measurement of the scan coils dynamic response as a slow scan was performed to obtain a nearly dynamics-free image of the sample. In panel ii) the beam was stepped from one extreme of the scan range to the other while recording from the secondary electron detector. This fast scan resulted in a smeared or distorted image. Landmarks (A, B, and C) on both images were located, and then an approximate step response (plot in iii) was extracted that shows where the beam actually was at each point in time. The vertical axis of (iii) is beam location (horizontally in i and ii) and the horizontal axis is time. The beam was commanded to move from the bottom of the figure (left side of the image) to the top (right side) instantaneously, so the plotted curve represents how close the actual position was to the commanded position as a function of time.

The data showed the dynamics of the beam are slow compared to the sampling period (400 ns). The 90% rise time was approximately 12 μs, the 99% rise time about 32 μs, and the 99.9% rise time approximately ¼ ms. Note that the 99.9% rise time is relevant; when making scans of several thousand pixels per line, an error of 0.1% corresponds to several pixels. The lowest order linear model to fit the data points well was fifth-order of the form of equation (1) where x(t) is the true one-dimensional probe position (in pixels) at time t, x̂(t) is the desired position, and the best-fit parameters $\{a_0, \ldots, a_4\}$ are listed in Table 1. The same dynamical model was used for both horizontal and vertical beam deflection.

TABLE 1

| parameter | value |
|---|---|
| $\alpha_0$ | $4.42 \times 10^{-4}$ |
| $\alpha_1$ | $8.20 \times 10^{-3}$ |
| $\alpha_2$ | $5.49 \times 10^{-2}$ |
| $\alpha_3$ | $2.46 \times 10^{-1}$ |
| $\alpha_4$ | $4.60 \times 10^{-1}$ |

Example 6

Figure 11:
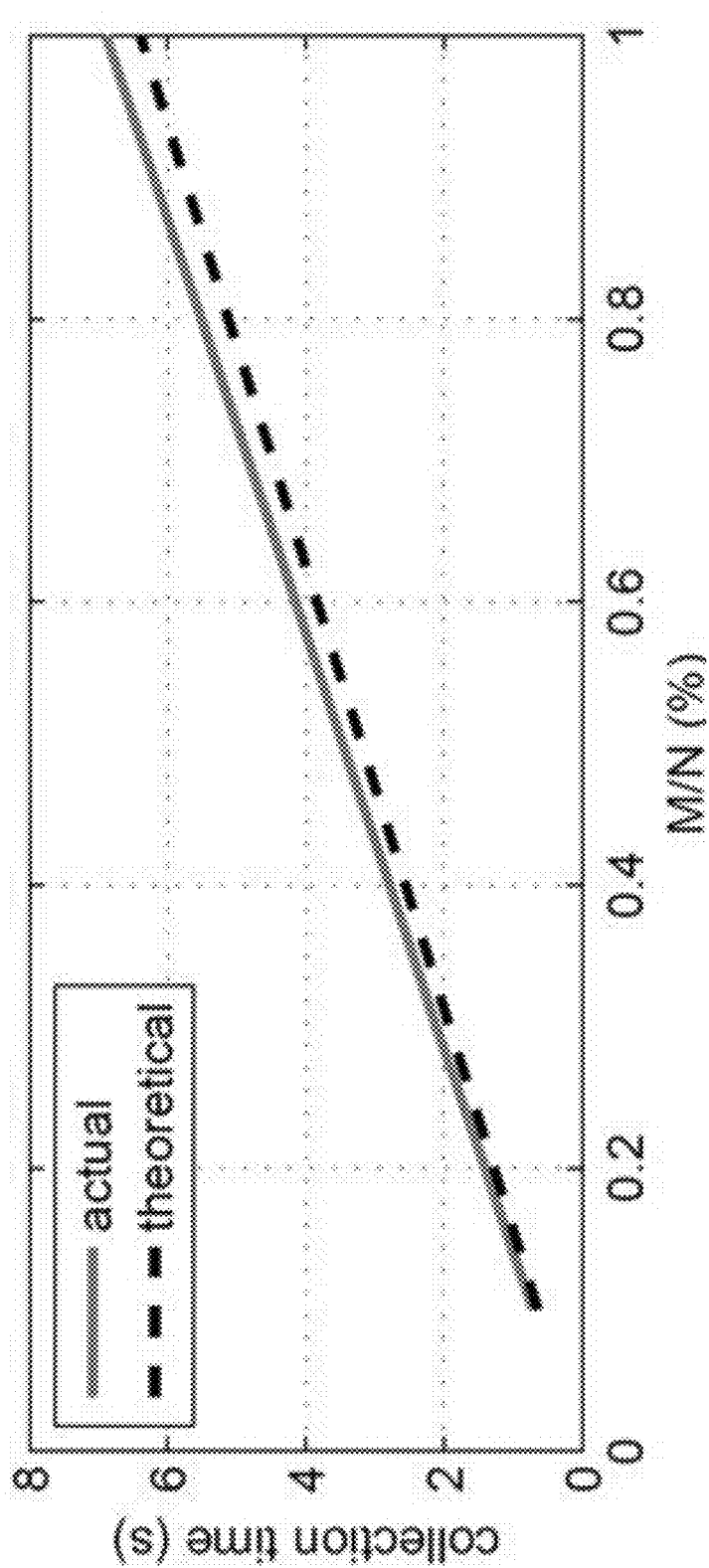
FIG. 11 is a plot of collection time vs. M/N (%) for actual and theoretical measured image acquisition times for collecting every pixel of a 1000×1000 image.

The measured image acquisition time for collecting every pixel of a 1000×1000 image with 16 samples per pixel was determined to be 6.9 s. An image acquisition time of 6.4 s was expected at 2.5 MHz. Using sparse sampling factors of 10%, 30% and 50%, image collection times of 0.7 s (9.9× speedup), 2.1 s (3.3× speedup), and 3.5 s (2.0× speedup), respectively, for 1000×1000 images. These collection times were only slightly more than what would be predicted at 2.5 MHz, and this can be ascribed to software overhead. Nevertheless, the collection time indeed grows linearly with the number of samples M, as shown in FIG. 11.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference. The term "random" when used by itself herein may include both random and pseudo-random as those terms are technically defined in the art.

All patents, patent applications, publications, technical and/or scholarly articles, and other references cited or referred to herein are in their entirety incorporated herein by reference to the extent allowed by law. The discussion of those references is intended merely to summarize the assertions made therein. No admission is made that any such patents, patent applications, publications or references, or any portion thereof, are relevant, material, or prior art. The right to challenge the accuracy and pertinence of any assertion of such patents, patent applications, publications, and other references as relevant, material, or prior art is specifically reserved.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method for conducting electron or scanning probe microscopy, the method comprising:
    driving an electron beam or probe to scan across a sample and visit a subset of pixel locations of the sample that are randomly or pseudo-randomly designated;
    determining actual pixel locations on the sample that are visited by the electron beam or probe; and
    processing data collected by detectors from the visits of the electron beam or probe at the actual pixel locations and recovering a reconstructed image of the sample.

2. The method of claim 1, wherein the driving of the electron beam is performed by electrostatic or electromagnetic scan coils.

3. The method of claim 2, wherein the determining of the actual pixel locations is based on results of modeling dynamics of the scan coils.

4. The method of claim 3, further comprising modeling the dynamics of the scan coils by:
    commanding a stepwise jump in position from one extreme of an electron beam or probe scan range to a second extreme in a calibration routine;
    during the stepwise jump of the electron beam or probe, recording output of a detector;
    comparing the recorded output of the detector with output recorded during a raster scan of the calibration sample; and
    plotting a beam location corresponding to the recorded output of the detector as a function of time.

5. The method of claim 3, wherein the modeling dynamics is based on at least a 5th-order dynamical model of the scan coils to determine the actual location of the probe or beam as a function of time.

6. The method of claim 1, wherein the desired pixel locations are not the same as the actual pixel locations.

7. The method of claim 1, wherein the electron beam or probe is driven electromagnetically or electrostatically.

8. The method of claim 1, further comprising recovering the reconstructed image of the sample by using a basis pursuit recovery algorithm utilizing compressibility of the acquired data for recovering the reconstructed image.

9. The method of claim 1, wherein the beam or probe continuously samples as it is in transit to a next pixel location of the subset of pixel locations.

10. The method of claim 1, wherein the samples are distributed across multiple pixel locations as the beam or probe is in transit to a next pixel location of the subset of pixel locations.

11. The method of claim 1, wherein the sample is sensitive to overdosing.

12. An electron microscope imaging system comprising:
    a processor; and
    a computer-readable memory that comprises a plurality of components that are executed by the processor, the plurality of components comprising:
        a command component configured to command an electron beam or probe to scan across a sample area and visit a subset of pixel locations of the sample area, the subset of pixel locations being randomly or pseudo-randomly designated;
        a determiner component configured to determine actual pixel locations on the sample area that are visited by the electron beam or probe; and
        a reconstruction component configured to process data collected by detectors from the visits of the electron beam or probe at the actual pixel locations and recover a reconstructed image from the processed data.

13. The electron microscope imaging system of claim 12, wherein the reconstruction component is executed by a distributed series of processors.

14. The electron microscope imaging system of claim 12, wherein the command component instructs the electron beam or probe to sample one half or fewer pixel locations.

15. The electron microscope imaging system of claim 12, wherein the reconstruction component is configured to recover the reconstructed image of the sample by using a basis pursuit recovery algorithm utilizing compressibility of the acquired data for recovering the reconstructed image.

16. The electron microscope imaging system of claim 12, wherein the command component is configured to command the beam or probe to continuously sample as the beam or probe is in transit to a next pixel location of the subset of pixel locations.

17. The electron microscope imaging system of claim 12, wherein the command component is configured to sample across multiple pixel locations as the beam or probe is in transit to a next pixel location of the subset of pixel locations.

18. An electronic microscope comprising:
    an electron gun that emits an electron beam;
    scan coils that deflect the electron beam;
    a sample area comprising pixel locations;
    a processor, wherein the processor drives the scan coils to deflect the electron beam onto the pixel locations; and
    a computer-readable memory that comprises a plurality of components that are executed by the processor, the plurality of components comprising:
        a command component configured to command an electron beam or probe to scan across a sample area and visit a subset of pixel locations of the sample area, the subset of pixel locations being randomly or pseudo-randomly designated;
        a determiner component configured to determine actual pixel locations on the sample area that are visited by the electron beam or probe; and
        a reconstruction component configured to process data collected by detectors from the visits of the electron beam or probe at the actual pixel locations and recover a reconstructed image from the processed data.

19. The electron microscope of claim 18, wherein the reconstruction component is configured to recover the reconstructed image of the sample by using a basis pursuit recovery algorithm utilizing compressibility of the acquired data for recovering the reconstructed image.

20. The electron microscope of claim 18, wherein the command component is configured to sample across multiple pixel locations as the beam or probe is in transit to a next pixel location of the subset of pixel location.

* * * * *